March 20, 1962 J. L. WALSH ETAL 3,026,487
PULSE GENERATORS
Filed June 30, 1959

INVENTOR
James L. Walsh &
Philip M. Marino
BY Geoffrey Knight
ATTORNEY

United States Patent Office 3,026,487
Patented Mar. 20, 1962

3,026,487
PULSE GENERATORS

James L. Walsh, Hyde Park, and Philip M. Marino, Poughkeepsie, N.Y., assignors to International Business Machines Corporation, New York, N.Y., a corporation of New York Filed June 30, 1959, Ser. No. 823,921
4 Claims. (Cl. 331—116)

The present invention relates to pulse generators, and, particularly, to pulse generators employing transistors for producing rectangular output pulses.

Substantially rectangular output pulses, which may have a repetition rate in the kilocycle or in the megacycle ranges, are required in the timing circuits of many devices. Difficulties have been encountered with prior transistor pulse generators intended for such timing applications. Some such generators have included circuits wherein the transistors periodically operated in their saturated region or have depended upon a periodic blocking action occasioned by the saturation of transformers. Others have relied upon the cyclic charging and discharging of time-constant networks for establishing the frequency of the generated pulses. The saturation of those elements and the discharging of networks, while necessary in the operation of those generators, created time delays in the cyclic return of the circuits to one of their operating conditions. This not only impaired the steepness of the trailing edge of the generated output pulses but also prevented the pulse generators from operating at as high a frequency as was desired for some applications.

It is an object of the present invention, therefore, to provide a new and improved transistor pulse generator which avoids one or more of the above-mentioned disadvantages and limitations of prior such generators.

It is an important object of the invention to provide a new and improved pulse generator employing transistors, the operation of which does not depend upon the saturation of various circuit elements such as those transistors.

It is another object of the present invention to provide a new and improved pulse generator for generating output pulses which have steep edge portions and may be used for precise timing purposes at frequencies above one megacycle.

It is a further object of the invention to provide a new and improved transistor pulse generator which affords stable operation while developing output pulses having a repetition rate in the megacycle range.

It is a further object of the invention to provide a new and improved pulse generator which is relatively simple in construction and inexpensive to manufacture.

Briefly, the pulse generator of this invention includes a pair of suitable transistors which may be of the junction type. One of the transistors is included in an oscillatory circuit while the other provides a rectangular output wave and also affords a controlling action which assures sustained oscillations in the oscillatory circuit. Current-mode switching is employed wherein both transistors are supplied with current from the same constant-current source which is capable of supplying current such that only one transistor at a time may be conductive. The developed oscillations control the conductive state of the output transistor which in turn shock excites the oscillatory circuit so as to develop sustained oscillations.

The foregoing and other objects, features and advantages of the invention will be apparent from the following more particular description of a preferred embodiment of the invention, as illustrated in the accompanying drawings.

Figure 1:
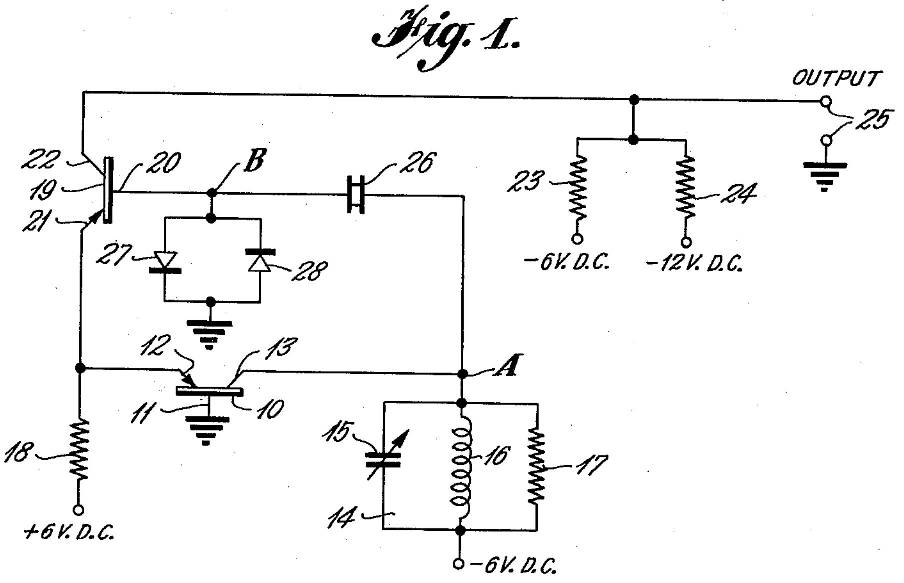
FIG. 1 is a circuit diagram of a particular form of the present invention.

*Description of FIG. 1 Pulse Generator*

Referring to FIG. 1, the pulse generator there represented includes a transistor 10, preferably of the junction type such as a PNP device, having a grounded base 11, an emitter 12, and a collector 13. The latter is connected to a negative source of D.C. potential through a parallel-resonant circuit 14. Across the latter is a suitable damping resistor 17 for limiting the amplitude excursions of the voltage wave developed across the resonant circuit. Variable capacitor 15 and inductor 16 determine the desired frequency of operation of the resonant circuit. For some applications the distributed capacitance of the inductor 16 may replace the capacitor 15. The emitter 12 of transistor 10 is connected to a positive D.C. potential through a resistor 18.

The pulse generator also includes a transistor 19, of the same conductivity type as transistor 10, which has a base 20, an emitter 21, and a collector 22. The emitter 21 is also connected to a positive D.C. potential through the resistor 18. Rectangular wave output pulses are obtained at the terminals 25, 25, one of which is connected to the collector 22 and the other of which is grounded. A voltage divider network consisting of resistors 23 and 24 provides the necessary negative operating potential for the collector 22 of transistor 19. The sinusoidal output of the resonant circuit 14 at point A is coupled to the base 20 of transistor 19 through a piezo-electric crystal 26 which is series resonant at the frequency of the resonant circuit 14. For some applications wherein precise frequency stability is not required, a suitable coupling capacitor may be substituted for the crystal 26. The base 20 of transistor 19 is connected to ground through the back-to-back diodes 27 and 28 which serve symmetrically to limit the signal appearing at point B in the circuit.

While the pulse generator has been described in connection with transistors of the PNP type, it will be apparent to one skilled in the art that NPN transistors may be employed in lieu thereof with suitable operating potentials of the required polarity. For operation at lower frequencies, the transistors 10 and 19 may be of the alloy function type. For higher frequency applications, diffused base transistors are preferable.

*Explanation of Operation of FIG. 1 Pulse Generator*

Figure 2:
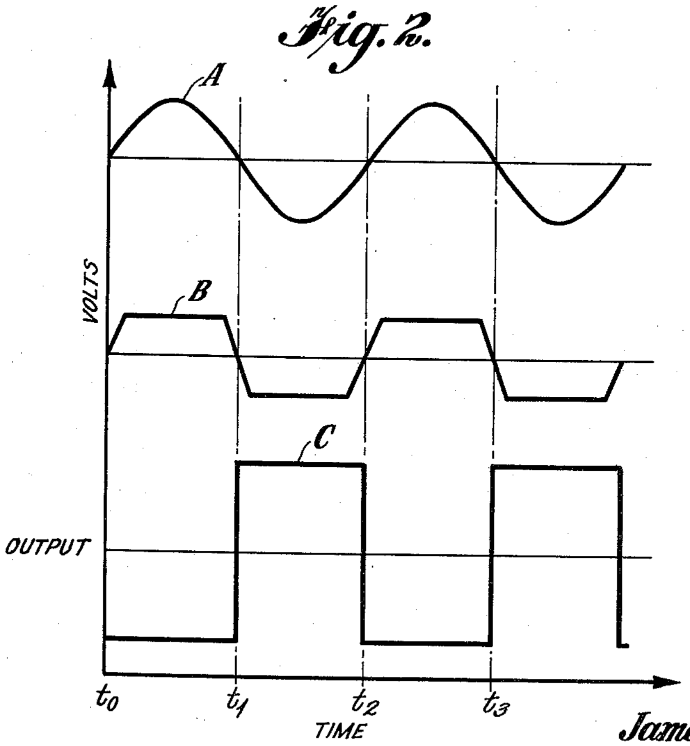
FIG. 2 represents a plurality of typical wave forms at various points in the circuit of FIG. 1.

At the instant power is applied, transistor 10 conducts since its emitter 12 is forward biased and its collector 13 is reverse biased. The initial surge of current shock excites the resonant circuit 14 into oscillation. The voltage at the collector 13 of transistor 10 and hence at point A will vary in the manner represented by Curve A of FIG. 2. As previously mentioned, the resistor 17 damps the developed oscillations and, by limiting the extent of the voltage swing, prevents the flow of saturation current in the transistor 10. This voltage variation is coupled to the base 20 of transistor 19 through the series resonant crystal 26 which presents a low impedance at the oscillator frequency. The voltage at point B varies in the manner represented by Curve B of FIG. 2 as a result of symmetrical clipping afforded by the diodes 27 and 28. In accordance with a particular embodiment of the invention, on the positive half cycles of the wave of Curve A, the diode 27 conducts and clips at about the plus 0.4 volt level. On the negative half cycles the diode 28 conducts and clips the voltage wave at about the minus 0.4 volt level. The negative half cycles of the wave of Curve B turn the transistor 19 on abruptly while the positive half cycles abruptly render it nonconductive.

When the transistor 10 is conducting during the interval $t_0$—$t_1$, the emitter 21 of transistor 19 will be at approximately ground potential as a result of the low resistance path between the emitter 12 and base 11 of transistor 10. The voltage at base 20 of transistor 19 then will be at about plus 0.4 volt as shown in Curve B of FIG. 2, thereby reverse biasing the emitter-base junction of transistor 19 and causing it to be nonconductive. The voltage appearing at the output terminals 25, 25 then has its most negative value as determined by the voltage divider 23, 24 and as represented by Curve C during the interval $t_0$—$t_1$.

When the oscillations of the resonant circuit 14 represented in Curve A swing in a negative direction during the interval $t_1$—$t_2$, the voltage at the base 20 of transistor 10 swings to about minus 0.4 volt, as represented in Curve B, thereby forward biasing transistor 19 and causing it to conduct. During that interval, the output potential at terminals 25, 25 abruptly rises positively as represented by Curve C. With transistor 19 conducting, the emitter 12 of transistor 10 will be held at about minus 0.4 volt through the low resistance path between the base 20 and emitter 21 of transistor 19, thus biasing transistor 10 to be nonconductive. As the oscillations of the resonant circuit 14 again swing positively as represented by Curve A during interval $t_2$—$t_3$, the voltage at the base 20 of transistor 19 swings to about plus 0.4 volt as shown by Curve B and cuts off the transistor 19. During interval $t_2$—$t_3$, the output wave abruptly swings negatively as shown by Curve C. As transistor 19 cuts off, conduction will again shift to transistor 10 and the cyclic operation continues in the manner previously explained.

The resistor 17, which limits the amplitude of the voltage developed across the resonant circuit to a swing of about plus or minus 3 volts, not only protects the crystal 26 from damage at low frequencies but also further assures that the transistor 10 does not go into saturation. This reduces collector capacitance and reduces frequency variations that would occur with different transistors of the same type having variations in collector capacitance. By operating both transistor 10 and 19 well out of saturation, a much faster recovery time is achieved, providing faster rise and fall times of the rectangular output wave.

The transistor pulse generator described above makes use of the technique whereby a well defined or constant current is switched between two parallel current paths by relatively small voltage variations of less than one volt such as the variations appearing at the base electrode of the transistor 19. This small voltage variation is effective alternately to switch the current flowing from the constant-current source from one of the current-translating paths to the other. Since the voltage excursions handled by the transistor circuits are small, very little time is lost in charging and discharging inherent or associated circuit capacitances. Thus frequency response is greatly improved. The impedance levels of the circuits of the pulse generator under consideration are low and this in turn reduces the time constants of the networks including those impedances and circuit capacitances. Saturation and the consequent phenomenon of minority-carrier storage in the transistors are avoided by the translation of well defined currents which are outside of the saturation region of the transistors. This tends to minimize "turn off" delay and greatly promotes high-speed switching operation. These factors not only promote high-speed operation but also enhance the generation of pulses which have steep leading and trailing edges and are capable of affording very precise timing operations.

While applicant does not wish to be limited by any particular circuit constants, the following have proved useful in a pulse generator of the type represented in FIG. 1:

| | |
|---|---|
| Resistor **17** | 1800 ohms. |
| Resistor **18** | 910 ohms. |
| Resistor **23** | 240 ohms. |
| Resistor **24** | 2400 ohms. |
| Capacitor **15** | 270 micromicrofarads (max.) |
| Inductor **16** | 100 microhenries. |
| Diodes **27** and **28** | Transitron type T14G. |
| Crystal **26** | Bliley type MC9. |
| Resonant frequency | 1 megacycle. |
| Transistors **11** and **19** | IBM type 015 PNP drift. |
| Output pulses | 1.2 volts peak to peak at a 10 megacycle. |
| Rate; rise and fall time | About 10 millimicroseconds. |

From the foregoing description and explanation of the operation of the pulse generator, it will be seen that the connection between the collector 13 or output electrode of transistor 10 and the base 20, which is common to the input and output circuits of transistor 19, together with the back-to-back voltage limiting diodes 27 and 28 constitute a means, including cross coupling means between an electrode of one transistor and a dissimilar electrode of another transistor, which is responsive to the polarity of oscillations developed in the resonant circuit 14 for concurrently changing the conductivity of either of the transistors in a sense opposite to that of the other to develop rectangular output pulses at the terminals 25, 25.

While the invention has been particularly shown and described with reference to a preferred embodiment thereof, it will be understood by those skilled in the art that various changes in form and details may be made therein without departing from the spirit and scope of the invention.

We claim:

1. A pulse generator comprising: a pair of transistors each having base, emitter and collector electrodes; means for providing a plurality of different operating potentials including a reference potential; a common connecting means connecting the emitter electrodes of each of said transistors to one of said operating potentials; a resonant circuit, one terminal of which is connected to the collector electrode of one of said transistors and the other terminal of which is connected to another one of said operating potentials; means connecting said one terminal of said resonant circuit to the base electrode of the other of said transistors; voltage-clipping means connecting the base electrode of said other transistor to said reference potential; said clipping means responsive to the polarity of oscillations of said resonant circuit to alternately switch the current from said common connecting means from one of said transistors to the other, means connecting the base of said one transistor to one of said operating potentials; and signal-output means connected to the collector electrode of said other transistor for deriving an output signal therefrom.

2. A pulse generator comprising: a pair of transistors of the same conductivity type, each having base, emitter and collector electrodes; means for providing a plurality of different operating potentials including a reference potential; a common connecting means connecting the emitter electrodes of each of said transistors to one of said operating potentials; a resonant circuit, one terminal of which is connected to the collector electrode of one of said transistors and the other terminal of which is connected to another one of said operating potentials; means connecting said one terminal of said resonant circuit to the base electrode of the other of said transistors; means connecting the base of said one transistor to one of said operating potentials; voltage-clipping diodes connected in back-to-back relation between the base electrode of said other transistor and said reference potential; said clipping diodes responsive to the polarity of oscillations of said resonant circuit to alternately switch the current from said common connecting means from one of said transistors to the other, and signal-output means connected to the collector electrode of said other transistor for deriving an output signal therefrom.

3. A pulse generator comprising: a pair of transistors of the same conductivity type, each having base, emitter and collector electrodes, means for providing a plurality of different operating potentials including a reference potential; a common connecting means connecting the emitter electrodes of each of said transistors to one of said operating potentials; a resonant circuit, one terminal of which is connected to the collector electrode of one of said transistors and the other terminal of which is connected to another one of said operating potentials; a frequency-determining crystal connecting one terminal of said resonant circuit to the base electrode of the other of said transistors; means connecting the base of said one transistor to one of said operating potentials; voltage-clipping crystal diodes connected in back-to-back relation between the base electrode of said other transistor and said reference potential; said clipping diodes responsive to the polarity of oscillations of said resonant circuit to alternately switch the current from said common connecting means from one of said transistors to the other, and signal-output means connected to the collector electrode of said other transistor for deriving an output signal therefrom.

4. A pulse generator comprising: a pair of transistors having base, emitter and collector electrodes; means for providing a plurality of different voltages including a reference potential; connecting means connecting the electrodes to appropriate ones of said different voltages; a resistive impedance interposed in said connecting means common to the emitter electrodes of both said transistors, a resonant circuit interposed in said connecting means to the collector electrode of one of said transistors, a piezo-electric crystal which determines the frequency of generated pulses connecting the collector electrode of said one transistor to the base electrode of the other of said transistors; said resonant circuit being tuned to substantially the frequency of said crystal; means connecting the base of said one transistor to one of said operating potentials; and a pair of oppositely poled unidirectionally conductive devices individually connecting the base electrode of said other transistor to said reference potential, said unidirectionally conductive devices being alternately conductive in response to the polarity of oscillations of said resonant circuit for concurrently switching the current supplied through said resistive impedance from one of said transistors to the other changing the conductivity state of either of said transistors in a sense opposite to that of the other to sustain oscillations of said resonant circuit.

References Cited in the file of this patent

UNITED STATES PATENTS

| | | |
|---|---|---|
| 2,207,511 | Geiger | July 9, 1940 |
| 2,553,165 | Bliss | May 15, 1951 |
| 2,693,536 | Hadfield | Nov. 2, 1954 |
| 2,794,124 | Purington | May 28, 1957 |
| 2,851,604 | Clapper | Sept. 9, 1958 |
| 2,912,654 | Hansen | Nov. 10, 1959 |

OTHER REFERENCES

Electronics, December 1954, pages 188, 190, 192.